United States Patent
Kim (10) Patent No.: US 10,026,469 B2
(45) Date of Patent: Jul. 17, 2018

(54) SEMICONDUCTOR DEVICE PERFORMING WRITE OPERATION AND WRITE LEVELING OPERATION

(71) Applicant: SK hynix Inc., Icheon-si Gyeonggi-do (KR)

(72) Inventor: Young Hoon Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/628,889

(22) Filed: Jun. 21, 2017

(65) Prior Publication Data

US 2018/0158509 A1     Jun. 7, 2018

(30) Foreign Application Priority Data

Dec. 6, 2016 (KR) .................. 10-2016-0164785

(51) Int. Cl.
| | |
|---|---|
| G11C 11/34 | (2006.01) |
| G11C 11/412 | (2006.01) |
| H01L 27/02 | (2006.01) |
| H01L 27/092 | (2006.01) |
| G11C 7/10 | (2006.01) |
| H01L 27/105 | (2006.01) |

(52) U.S. Cl.
CPC .......... *G11C 11/412* (2013.01); *G11C 7/1039* (2013.01); *G11C 7/1072* (2013.01); *H01L 27/0218* (2013.01); *H01L 27/0222* (2013.01); *H01L 27/0927* (2013.01); *H01L 27/105* (2013.01)

(58) Field of Classification Search
CPC ... G11C 29/50012; G11C 7/22; G11C 29/028; G11C 7/222; G11C 29/12015; G11C 7/06; G11C 7/1039; G11C 7/1072
USPC ............. 365/181, 191, 193, 194, 233.1
See application file for complete search history.

(56) References Cited

U.S. PATENT DOCUMENTS

| | | | |
|---|---|---|---|
| 7,835,205 B2 * | 11/2010 | Kim | H03L 7/0812 327/141 |
| 2005/0249016 A1 * | 11/2005 | Zanden | G11C 29/12015 365/230.03 |
| 2013/0141994 A1 | 6/2013 | Ito et al. | |

FOREIGN PATENT DOCUMENTS

KR        1020110018750 A     2/2011

* cited by examiner

*Primary Examiner* — Gene Auduong
(74) *Attorney, Agent, or Firm* — William Park & Associates Ltd.

(57) ABSTRACT

A semiconductor device includes an input clock generation circuit able to shift a write command in synchronization with a clock, and generating first and second input clocks. The semiconductor device also includes a write leveling control circuit able to divide a frequency of the clock in response to a write leveling control signal, and generating first to fourth write clocks. The semiconductor device includes a signal transfer circuit able to transfer the first and second input clocks as first and second transfer clocks in a write operation, and transferring the first to fourth write clocks as first to fourth transfer clocks in a write leveling operation.

20 Claims, 9 Drawing Sheets

SEMICONDUCTOR DEVICE PERFORMING WRITE OPERATION AND WRITE LEVELING OPERATION

CROSS-REFERENCE TO RELATED APPLICATION

The present application claims priority under 35 U.S.C. § 119(a) to Korean Patent Application No. 10-2016-0164785 filed on Dec. 6, 2016 in the Korean Intellectual Property Office, which is incorporated herein by reference in its entirety.

BACKGROUND

1. Technical Field

Various embodiments generally relate to a semiconductor device which shares a transfer path for a write operation and a transfer path for a write leveling operation.

2. Related Art

Recently, as the operation speed of semiconductor systems have increased, a high data transfer rate is being required among the semiconductor devices included in the semiconductor system. In order to satisfy a high data transfer rate or a high bandwidth for data to be inputted/outputted in series among semiconductor devices, a prefetch operation is applied. Prefetch means to latch and parallelize the data inputted in series. In order to parallelize data, clocks having different phases, that is, internal clocks having multiple phases, are generated in a semiconductor device and are used for inputting/outputting data.

SUMMARY

Various embodiments are directed to a semiconductor device which shares a transfer path for a write operation and a transfer path for a write leveling operation, thereby substantially preventing a tDQSS characteristic from being degraded.

Also, various embodiments are directed to a semiconductor device which shares a transfer path for a write operation and a transfer path for a write leveling operation, thereby reducing an area of the device and decreasing the number of input/output lines.

In an embodiment, a semiconductor device may include: an input clock generation circuit suitable for shifting a write command in synchronization with a clock, and generating first and second input clocks; a write leveling control circuit suitable for dividing a frequency of the clock in response to a write leveling control signal, and generating first to fourth write clocks; and a signal transfer circuit suitable for transferring the first and second input clocks as first and second transfer clocks in a write operation, and transferring the first to fourth write clocks as first to fourth transfer clocks in a write leveling operation.

In an embodiment, a semiconductor device may include: a signal transfer circuit suitable for transferring first and second input clocks or first and second write clocks as respective first and second transfer clocks through respective first and second transfer paths in response to a write command and a write leveling control signal, and transferring third and fourth write clocks as respective third and fourth transfer clocks through respective third and fourth transfer paths; and an internal circuit suitable for detecting a phase difference between an internal clock generated by combining the first to fourth transfer clocks and a strobe signal, and storing input data synchronized with the strobe signal, as internal data, in synchronization with the internal clock.

According to the embodiments, advantages are provided in that, because a transfer path for a write operation and a transfer path for a write leveling operation are shared, it is possible to substantially prevent a tDQSS characteristic from being degraded.

Also, according to the embodiments, advantages are provided in that, because a transfer path for a write operation and a transfer path for a write leveling operation are shared, it is possible to reduce an area and decrease the number of input/output lines.

DETAILED DESCRIPTION

Hereinafter, a semiconductor device will be described below with reference to the accompanying drawings through various example embodiments.

Figure 1:
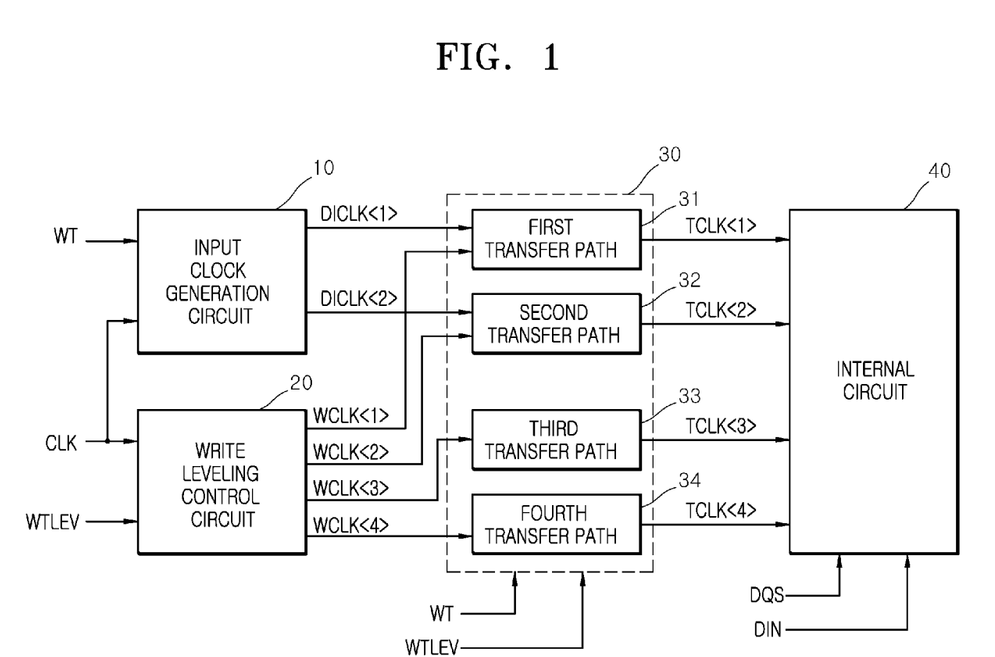
FIG. 1 is a block diagram illustrating a representation of an example of a configuration of a semiconductor device in accordance with an embodiment.

As shown in FIG. 1, a semiconductor device in accordance with an embodiment may include an input clock generation circuit 10, a write leveling control circuit 20, a signal transfer circuit 30, and an internal circuit 40.

The input clock generation circuit 10 may shift a write command WT in synchronization with a clock CLK, and generate first and second input clocks DICLK<1:2>, where generate as used herein includes at least one of creating and outputting. The input clock generation circuit 10 may shift the write command WT in synchronization with a rising edge of the clock CLK, and generate the first input clock DICLK<1>. The input clock generation circuit 10 may shift the first input clock DICLK<1> in synchronization with a falling edge of the clock CLK, and generate the second input clock DICLK<2>. The input clock generation circuit 10 may generate the second input clock DICLK<2> after generating the first input clock DICLK<1> by shifting the write command WT in synchronization with the clock CLK in a write operation. The write command WT may be set as a signal and command which includes a pulse generated in the write operation.

The write leveling control circuit 20 may divide the frequency of the clock CLK in response to a write leveling control signal WTLEV, and generate first to fourth write clocks WCLK<1:4>. The write leveling control circuit 20 may divide the frequency of the clock CLK in response to the write leveling control signal WTLEV, and generate the first to fourth write clocks WCLK<1:4> which have different phases. The write leveling control circuit 20 may divide the frequency of the clock CLK, and generate the first to fourth write clocks WCLK<1:4> which have a phase difference of 90°. The write leveling control signal WTLEV may be a signal which is enabled to enter a write leveling operation for compensating for a phase difference between the clock CLK and a strobe signal DQS.

The signal transfer circuit 30 may include a first transfer path 31, a second transfer path 32, a third transfer path 33, and a fourth transfer path 34.

The first transfer path 31 may transfer the first input clock DICLK<1> as a first transfer clock TCLK<1> in the write operation. The first transfer path 31 may transfer the first write clock WCLK<1> as the first transfer clock TCLK<1> in the write leveling operation. The first transfer path 31 may transfer the first input clock DICLK<1> as the first transfer clock TCLK<1> in response to the write command WT and the write leveling control signal WTLEV. The first transfer path 31 may transfer the first write clock WCLK<1> as the first transfer clock TCLK<1> in response to the write command WT and the write leveling control signal WTLEV.

The second transfer path 32 may transfer the second input clock DICLK<2> as a second transfer clock TCLK<2> in the write operation. The second transfer path 32 may transfer the second write clock WCLK<2> as the second transfer clock TCLK<2> in the write leveling operation. The second transfer path 32 may transfer the second input clock DICLK<2> as the second transfer clock TCLK<2> in response to the write command WT and the write leveling control signal WTLEV. The second transfer path 32 may transfer the second write clock WCLK<2> as the second transfer clock TCLK<2> in response to the write command WT and the write leveling control signal WTLEV.

The third transfer path 33 may transfer the third write clock WCLK<3> as a third transfer clock TCLK<3> in the write leveling operation. The third transfer path 33 may transfer the third write clock WCLK<3> as the third transfer clock TCLK<3> in response to the write leveling control signal WTLEV.

The fourth transfer path 34 may transfer the fourth write clock WCLK<4> as a fourth transfer clock TCLK<4> in the write leveling operation. The fourth transfer path 34 may transfer the fourth write clock WCLK<4> as the fourth transfer clock TCLK<4> in response to the write leveling control signal WTLEV.

The internal circuit 40 may detect a phase difference between an internal clock ICLK (see FIG. 6) generated by combining the first to fourth transfer clocks TCLK<1:4> and the strobe signal DQS. The internal circuit 40 may store input data DIN synchronized with the strobe signal DQS, as internal data ID (see FIG. 6) in synchronization with the internal clock ICLK.

Figure 2:
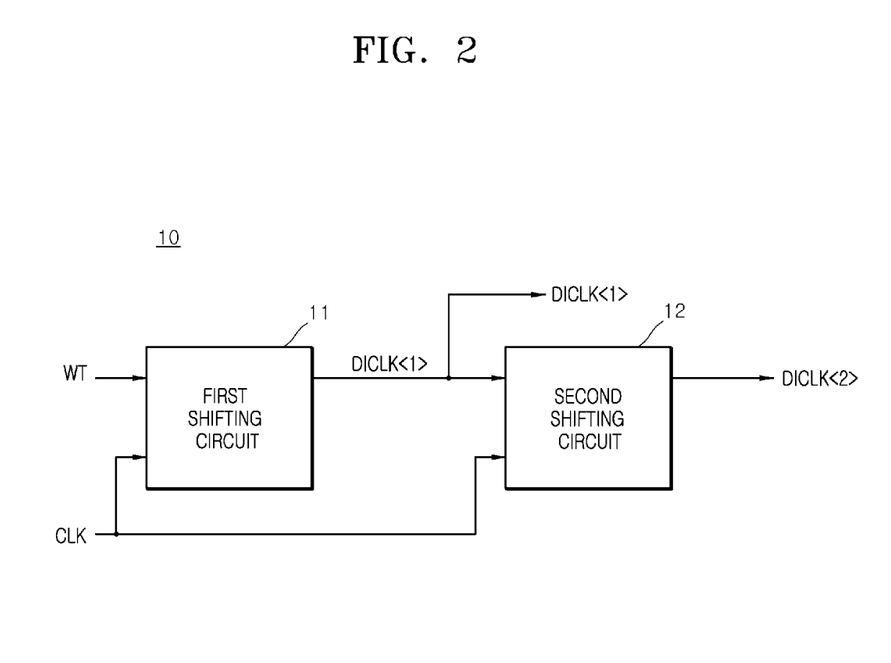
FIG. 2 is a block diagram illustrating a representation of an example of a configuration of an input clock generation circuit included in the semiconductor device shown in FIG. 1.

Referring to FIG. 2, the input clock generation circuit 10 may include a first shifting circuit 11 and a second shifting circuit 12.

The first shifting circuit 11 may shift the write command WT in response to the clock CLK and generate the first input clock DICLK<1>. The first shifting circuit 11 may shift the write command WT in synchronization with the rising edge of the clock CLK and generate the first input clock DICLK<1>. The first shifting circuit 11 may be realized by a flip-flop generally known in the art and shift the write command WT and generate the first input clock DICLK<1>.

The second shifting circuit 12 may shift the first input clock DICLK<1> in response to the clock CLK and generate the second input clock DICLK<2>. The second shifting circuit 12 may shift the first input clock DICLK<1> in synchronization with the falling edge of the clock CLK and generate the second input clock DICLK<2>. The second shifting circuit 12 may be realized by a flip-flop generally known in the art and shift the first input clock DICLK<1> and generate the second input clock DICLK<2>.

Figure 3:
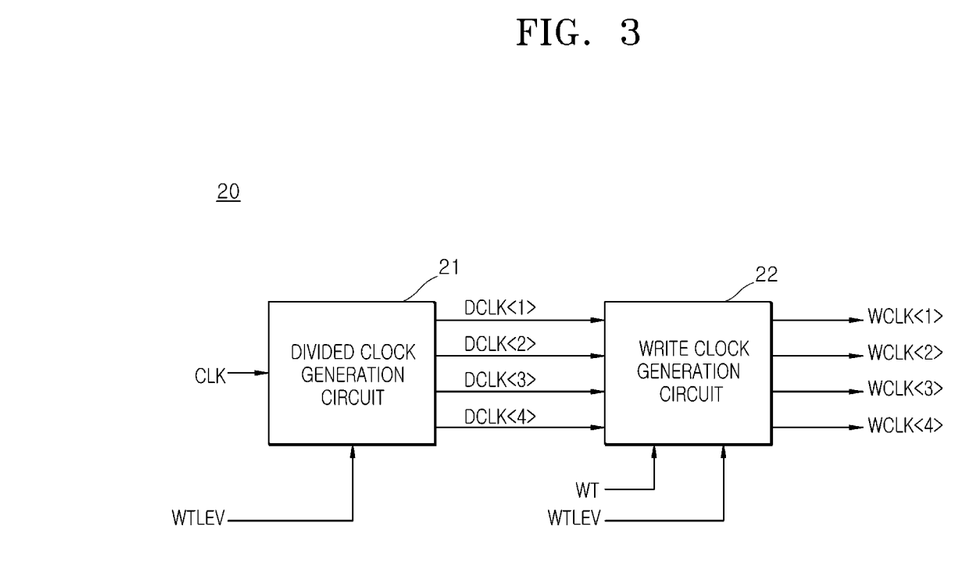
FIG. 3 is a block diagram illustrating a representation of an example of a configuration of a write leveling control circuit included in the semiconductor device shown in FIG. 1.

Referring to FIG. 3, the write leveling control circuit 20 may include a divided clock generation circuit 21 and a write clock generation circuit 22.

The divided clock generation circuit 21 may generate first to fourth divided clocks DCLK<1:4> which are frequency-divided in response to the clock CLK. The divided clock generation circuit 21 may divide the frequency of the clock CLK and generate the first to fourth divided clocks DCLK<1:4> which have different phases. The phase difference of the first to fourth divided clocks DCLK<1:4> may be set to 90°.

The write clock generation circuit 22 may output the first to fourth divided clocks DCLK<1:4> as the first to fourth write clocks WCLK<1:4> in the write operation or the write leveling operation. The write clock generation circuit 22 may output the first to fourth divided clocks DCLK<1:4> as the first to fourth write clocks WCLK<1:4> in response to the write command WT and the write leveling control signal WTLEV. The write clock generation circuit 22 may output the first to fourth divided clocks DCLK<1:4> as the first to fourth write clocks WCLK<1:4> if any one of the write command WT and the write leveling control signal WTLEV is enabled. In one particular example, the first to fourth write clocks WCLK<1:4> may be signals which may be generated by dividing a frequency of the clock CLK in a write leveling operation.

Figure 4:
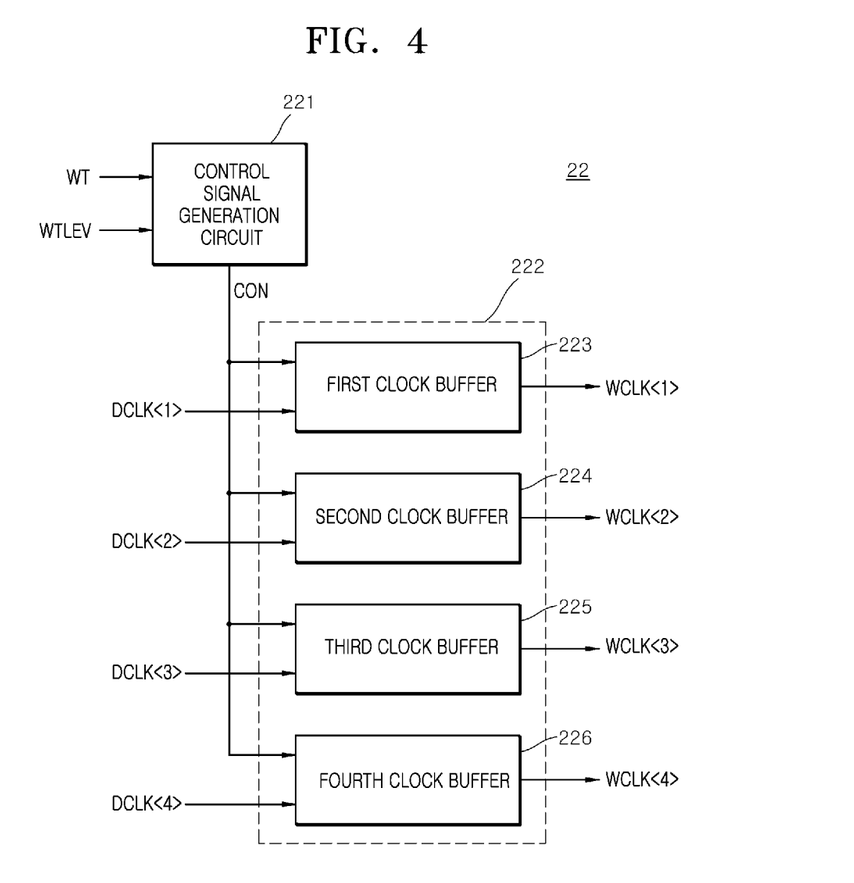
FIG. 4 is a block diagram illustrating a representation of an example of a configuration of a write clock generation circuit included in the write leveling control circuit shown in FIG. 3.

Referring to FIG. 4, the write clock generation circuit 22 may include a control signal generation circuit 221 and a buffer circuit 222. The buffer circuit 222 may include a first clock buffer 223, a second clock buffer 224, a third clock buffer 225, and a fourth clock buffer 226.

The control signal generation unit 221 may generate a control signal CON which is enabled in response to the write command WT and the write leveling control signal WTLEV. The control signal generation unit 221 may generate the control signal CON which is enabled if any one of the write command WT and the write leveling control signal WTLEV is inputted. Logic levels at which the write command WT and the write leveling control signal WTLEV are enabled may be set variously depending on the embodiment. A logic level at which the control signal CON is enabled may be set variously depending on an embodiment.

The first clock buffer 223 may buffer the first divided clock DCLK<1> in response to the control signal CON, and output the first write clock WCLK<1>. The first clock buffer 223 may buffer the first divided clock DCLK<1> and output the first write clock WCLK<1> if the control signal CON is enabled.

The second clock buffer 224 may buffer the second divided clock DCLK<2> in response to the control signal CON, and output the second write clock WCLK<2>. The second clock buffer 224 may buffer the second divided clock DCLK<2> and output the second write clock WCLK<2> if the control signal CON is enabled.

The third clock buffer 225 may buffer the third divided clock DCLK<3> in response to the control signal CON, and output the third write clock WCLK<3>. The third clock buffer 225 may buffer the third divided clock DCLK<3> and output the third write clock WCLK<3> if the control signal CON is enabled.

The fourth clock buffer 226 may buffer the fourth divided clock DCLK<4> in response to the control signal CON, and output the fourth write clock WCLK<4>. The fourth clock buffer 226 may buffer the fourth divided clock DCLK<4> and output the fourth write clock WCLK<4> if the control signal CON is enabled. Thus, the buffer circuit 222 may buffer at least one of the first to fourth divided clocks DCLK<1:4> in response to a control signal CON, and output at least one of the first to fourth write clocks WCLK<1:4>.

Figure 5:
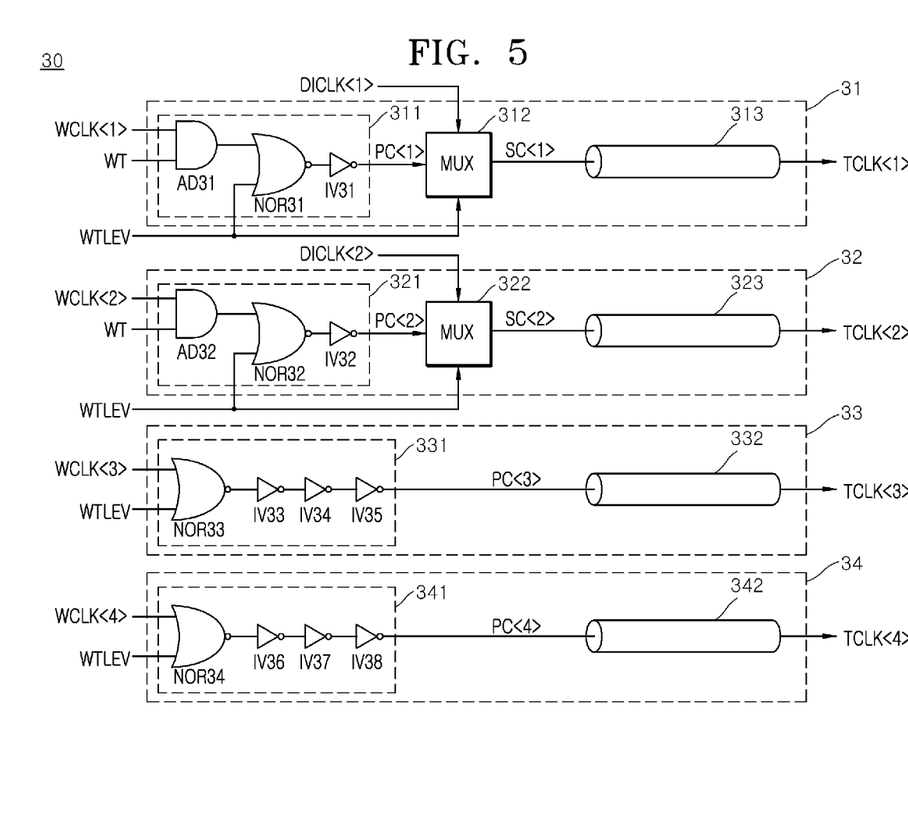
FIG. 5 is a diagram illustrating a representation of an example of a configuration of a signal transfer circuit included in the semiconductor device shown in FIG. 1.

Referring to FIG. 5, the signal transfer circuit 30 may include the first transfer path 31, the second transfer path 32, the third transfer path 33, and the fourth transfer path 34.

The first transfer path 31 may include a first logic circuit 311, a first selective transfer circuit 312, and a first input/output line 313.

The first logic circuit 311 may be realized by an AND gate AD31, a NOR gate NOR31, and an inverter IV31. The first logic circuit 311 may output the first write clock WCLK<1> as a first pre-clock PC<1> in response to the write command WT and the write leveling control signal WTLEV. The first logic circuit 311 may buffer the first write clock WCLK<1> and output the first pre-clock PC<1> if the write command WT is inputted at a logic high level and the write leveling control signal WTLEV is inputted at a logic low level. A logic level at which the write leveling control signal WTLEV is enabled may be set to a logic low level. A logic level at which the write leveling control signal WTLEV is enabled may be set variously depending on an embodiment.

The first selective transfer circuit 312 may output any one of the first pre-clock PC<1> and the first input clock DICLK<1> as a first selected clock SC<1> in response to the write leveling control signal WTLEV. The first selective transfer circuit 312 may output the first pre-clock PC<1> as the first selected clock SC<1> if the write leveling control signal WTLEV is enabled to the logic low level. The first selective transfer circuit 312 may output the first input clock DICLK<1> as the first selected clock SC<1> if the write leveling control signal WTLEV is disabled to a logic high level. The first selective transfer circuit 312 may be realized by a multiplexer generally known in the art.

The first input/output line 313 may transfer the first selected clock SC<1> as the first transfer clock TCLK<1>. The first input/output line 313 may be set as an input/output line through which a general signal or data is transferred in a semiconductor device.

The first transfer path 31 in accordance with the embodiment configured as mentioned above may transfer the first write clock WCLK<1> or the first input clock DICLK<1> as the first transfer clock TCLK<1> in response to the write command WT and the write leveling control signal WTLEV.

The second transfer path 32 may include a second logic circuit 321, a second selective transfer circuit 322, and a second input/output line 323.

The second logic circuit 321 may be realized by an AND gate AD32, a NOR gate NOR32, and an inverter IV32. The second logic circuit 321 may buffer the second write clock WCLK<2> and output a second pre-clock PC<2> in response to the write command WT and the write leveling control signal WTLEV. The second logic circuit 321 may output the second write clock WCLK<2> as the second pre-clock PC<2> if the write command WT is inputted at the logic high level and the write leveling control signal WTLEV is inputted at the logic low level.

The second selective transfer circuit 322 may output any one of the second pre-clock PC<2> and the second input clock DICLK<2> as a second selected clock SC<2> in response to the write leveling control signal WTLEV. The second selective transfer circuit 322 may output the second pre-clock PC<2> as the second selected clock SC<2> if the write leveling control signal WTLEV is enabled to the logic low level. The second selective transfer circuit 322 may output the second input clock DICLK<2> as the second selected clock SC<2> if the write leveling control signal WTLEV is disabled to the logic high level. The second selective transfer circuit 322 may be realized by a multiplexer generally known in the art.

The second input/output line 323 may transfer the second selected clock SC<2> as the second transfer clock TCLK<2>. The second input/output line 323 may be set as an input/output line through which a general signal or data is transferred in a semiconductor device.

The second transfer path 32 in accordance with the embodiment configured as mentioned above may transfer the second write clock WCLK<2> or the second input clock DICLK<2> as the second transfer clock TCLK<2> in response to the write command WT and the write leveling control signal WTLEV.

The third transfer path 33 may include a third logic circuit 331 and a third input/output line 332.

The third logic circuit 331 may be realized by a NOR gate NOR33 and inverters IV33, IV34, and IV35. The third logic circuit 331 may output the third write clock WCLK<3> as a third pre-clock PC<3> in response to the write leveling control signal WTLEV. The third logic circuit 331 may buffer the third write clock WCLK<3> and output the third pre-clock PC<3> if the write leveling control signal WTLEV is inputted at the logic low level.

The third input/output line 332 may transfer the third pre-clock PC<3> as the third transfer clock TCLK<3>. The third input/output line 332 may be set as an input/output line through which a general signal or data is transferred in a semiconductor device.

The third transfer path 33 in accordance with the embodiment configured as mentioned above may transfer the third write clock WCLK<3> as the third transfer clock TCLK<3> in response to the write leveling control signal WTLEV.

The fourth transfer path 34 may include a fourth logic circuit 341 and a fourth input/output line 342.

The fourth logic circuit 341 may be realized by a NOR gate NOR34 and inverters IV36, IV37, and IV38. The fourth logic circuit 341 may output the fourth write clock WCLK<4> as a fourth pre-clock PC<4> in response to the write leveling control signal WTLEV. The fourth logic circuit 341 may buffer the fourth write clock WCLK<4> and output the fourth pre-clock PC<4> if the write leveling control signal WTLEV is inputted at the logic low level.

The fourth input/output line 342 may transfer the fourth pre-clock PC<4> as the fourth transfer clock TCLK<4>. The fourth input/output line 342 may be set as an input/output line through which a general signal or data is transferred in a semiconductor device.

The fourth transfer path 34 in accordance with the embodiment configured as mentioned above may transfer the fourth write clock WCLK<4> as the fourth transfer clock TCLK<4> in response to the write leveling control signal WTLEV.

Figure 6:
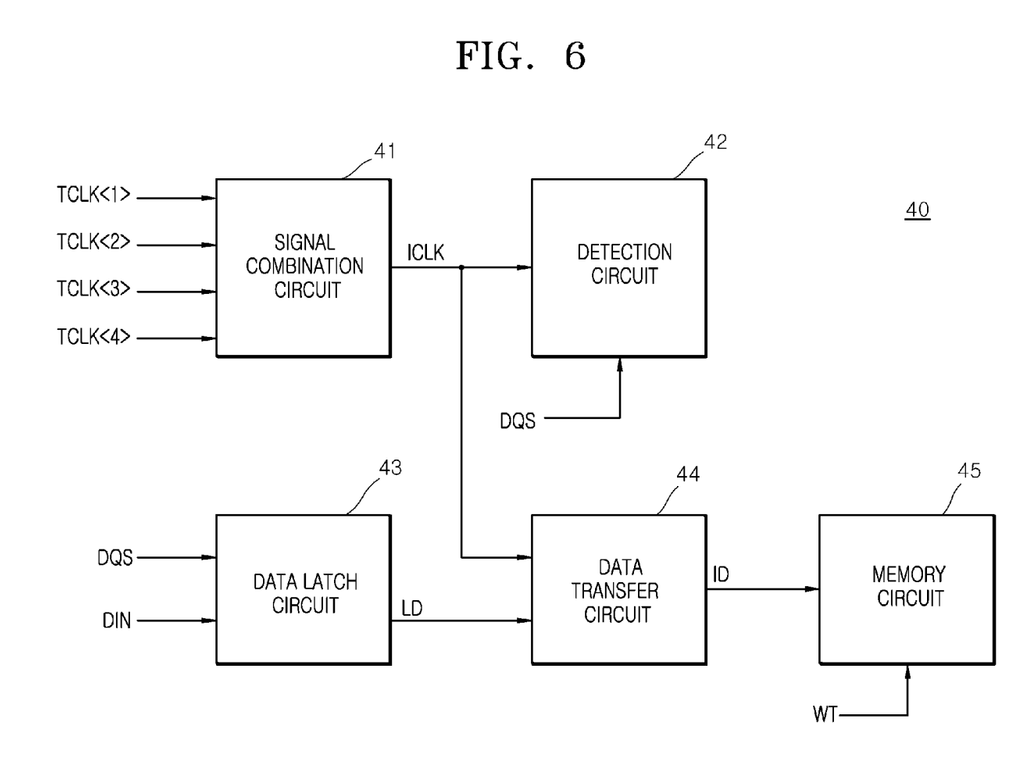
FIG. 6 is a block diagram illustrating a representation of an example of a configuration of an internal circuit included in the semiconductor device shown in FIG. 1.

Referring to FIG. 6, the internal circuit 40 may include a signal combination circuit 41, a detection circuit 42, a data latch circuit 43, a data transfer circuit 44, and a memory circuit 45.

The signal combination circuit 41 may combine the first to fourth transfer clocks TCLK<1:4> and generate the internal clock ICLK. The signal combination circuit 41 may generate the internal clock ICLK which toggles in response to rising edges of the first to fourth transfer clocks TCLK<1:4>.

The detection circuit 42 may compare the phase of the internal clock ICLK and the phase of the strobe signal DQS. The detection circuit 42 may detect phase differences between the strobe signal DQS and the internal clock ICLK by detecting the level of the internal clock ICLK at the rising edge of the strobe signal DQS. For example, if the level of the internal clock ICLK at the rising edge of the strobe signal DQS is a logic high level, the difference between the phase of the strobe signal DQS and the phase of the internal clock ICLK may fall within the specification of tDQSS. tDQSS indicates a specification for a domain crossing margin between the data strobe signal DQS and the clock CLK.

The data latch circuit 43 may latch the input data DIN in synchronization with the strobe signal DQS, and output the latched input data DIN as latch data LD. The data latch circuit 43 may be realized by a pipe latch circuit which employs prefetch. While the input data DIN is illustrated as one signal, it is to be noted that the input data DIN may be realized by a plurality of bits which are inputted in series. While the latch data LD is illustrated as one signal, it is to be noted that the latch data LD may be realized by a plurality of bits and be outputted in parallel.

The data transfer circuit 44 may transfer the latch data LD as the internal data ID in synchronization with the internal clock ICLK in the write operation. The data transfer circuit 44 may transfer the latch data LD as the internal data ID in synchronization with the internal clock ICLK which is generated from the first and second input clocks DICLK<1:2> in the write operation.

The memory circuit 45 may store the internal data ID in response to the write command WT. The memory circuit 45 may be realized by a general volatile memory or nonvolatile memory which is used in a semiconductor device.

Figure 7:
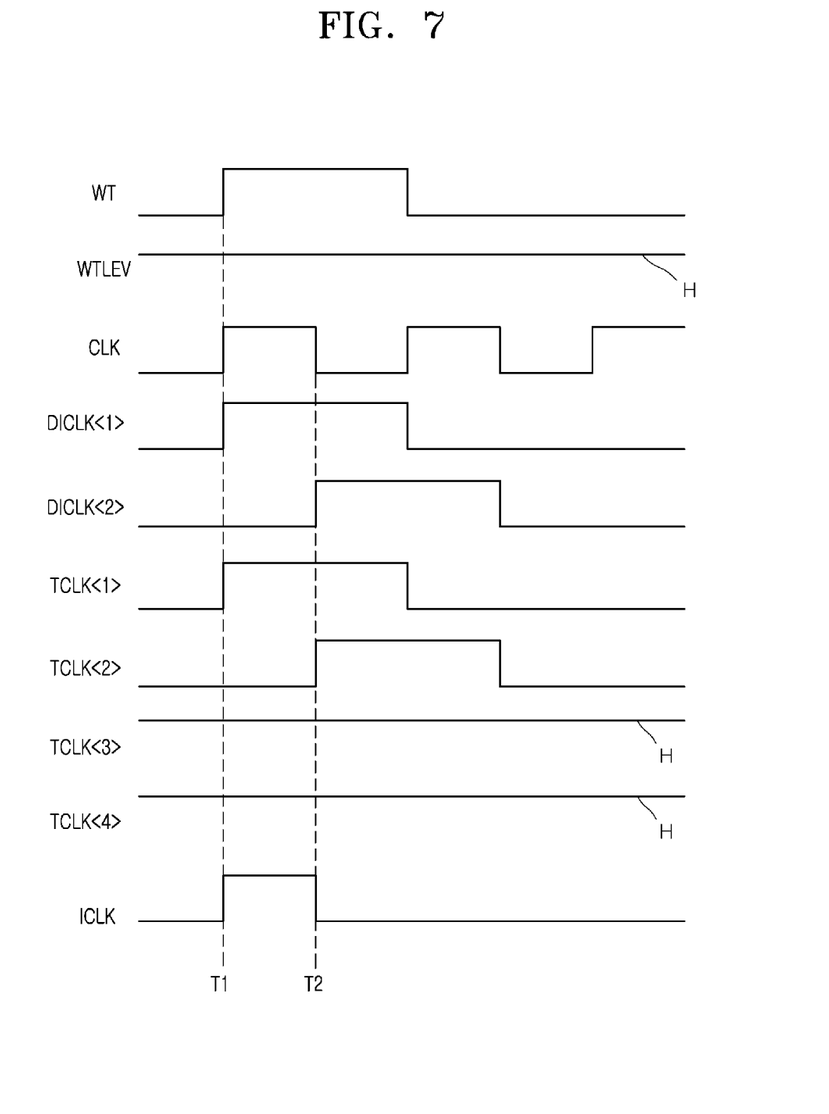
FIGS. 7 and 8 are representations of examples of timing diagrams to assist in an explanation of operations of the semiconductor device in accordance with an embodiment.

Descriptions will be made below with reference to FIG. 7 for an operation of generating the internal clock ICLK from the first and second input clocks DICLK<1:2> inputted through the first and second transfer paths 31 and 32 in the write operation of the semiconductor device in accordance with an embodiment.

At a time T1, the write command WT is inputted at the logic high level. The write command WT may be inputted as a pulse signal which is generated in the write operation or may be inputted as a level signal. In the write operation, the write leveling control signal WTLEV may be disabled to the logic high level. The reference symbol 'H' shown in FIG. 7 means a logic high level.

At the time T1, the first shifting circuit 11 of the input clock generation circuit 10 shifts the write command WT in synchronization with the rising edge of the clock CLK, and generates the first input clock DICLK<1> of a logic high level.

The first transfer path 31 transfers the first input clock DICLK<1> of the logic high level as the first transfer clock TCLK<1> in response to the write command WT of the logic high level and the write leveling control signal WTLEV of the logic high level. The write leveling control signal WTLEV is disabled to the logic high level because it is not the write leveling operation.

The second transfer path 32 transfers the second input clock DICLK<2> of a logic low level as the second transfer clock TCLK<2> in response to the write command WT of the logic high level and the write leveling control signal WTLEV of the logic high level.

The third transfer path 33 generates the third transfer clock TCLK<3> of a logic high level in response to the write leveling control signal WTLEV of the logic high level.

The fourth transfer path 34 generates the fourth transfer clock TCLK<4> of the logic high level in response to the write leveling control signal WTLEV of the logic high level.

The signal combination circuit 41 generates the internal clock ICLK which level-transitions to the logic high level in response to the rising edge of the first transfer clock TCLK<1>.

At a time T2, the second shifting circuit 12 of the input clock generation circuit 10 shifts the first input clock DICLK<1> in synchronization with the falling edge of the clock CLK, and generates the second input clock DICLK<2> of the logic high level.

The first transfer path 31 transfers the first input clock DICLK<1> of the logic high level as the first transfer clock TCLK<1> in response to the write command WT of the logic high level and the write leveling control signal WTLEV of the logic high level. The write leveling control signal WTLEV is disabled to the logic high level because it is not the write leveling operation.

The second transfer path 32 transfers the second input clock DICLK<2> of the logic high level as the second transfer clock TCLK<2> in response to the write command WT of the logic high level and the write leveling control signal WTLEV of the logic high level.

The third transfer path 33 generates the third transfer clock TCLK<3> of the logic high level in response to the write leveling control signal WTLEV of the logic high level.

The fourth transfer path 34 generates the fourth transfer clock TCLK<4> of the logic high level in response to the write leveling control signal WTLEV of the logic high level.

The signal combination circuit 41 generates the internal clock ICLK which level-transitions to a logic high level in response to the rising edge of the second transfer clock TCLK<2>.

In this way, the semiconductor device may generate the internal clock ICLK from the first and second input clocks DICLK<1:2> inputted as, for example, signals through the first and second transfer paths 31 and 32 in the write operation.

Figure 8:
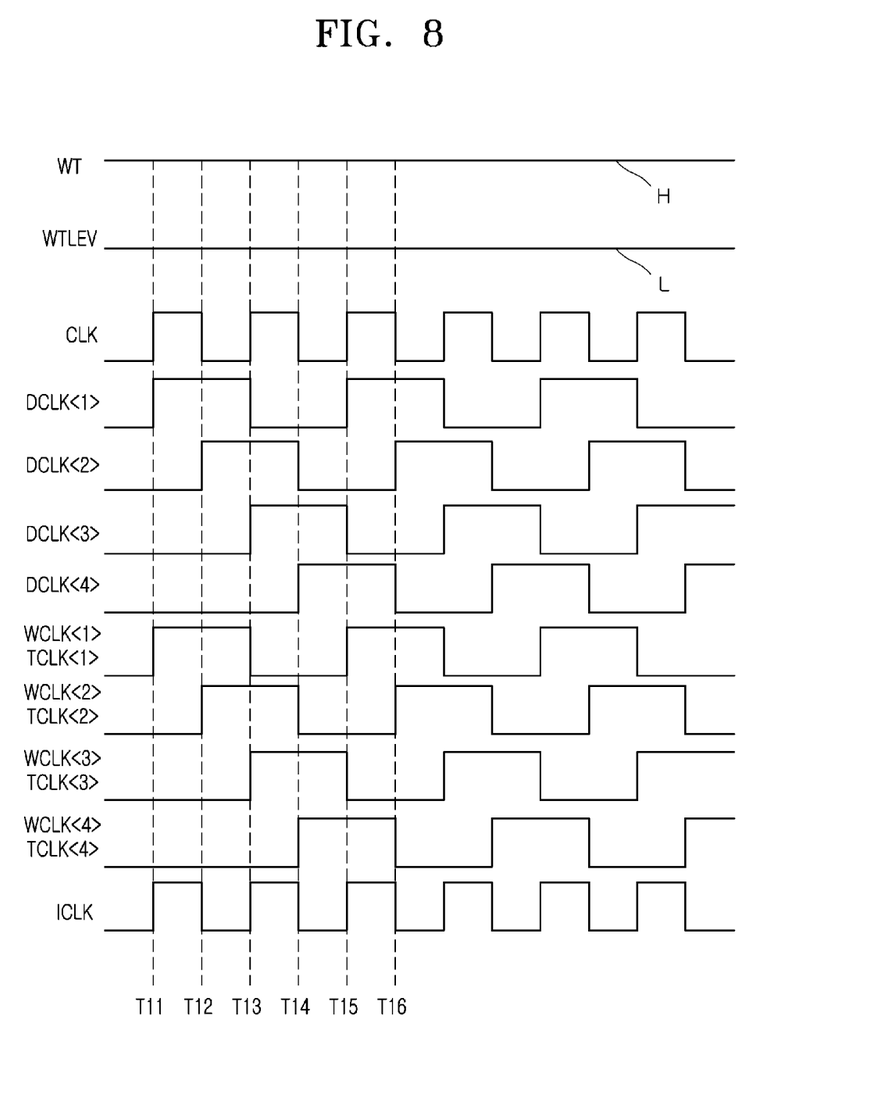

Descriptions will be made below with reference to FIG. 8 for an operation of generating the internal clock ICLK from the first to fourth divided clocks DCLK<1:4> inputted through the first to fourth transfer paths 31, 32, 33, and 34 in the write leveling operation of the semiconductor device in accordance with an embodiment.

In the write leveling operation, the write leveling control signal WTLEV may be enabled to the logic low level. Also, in the write leveling operation, the write command WT may be inputted at the logic high level. The reference symbol 'H' shown in FIG. 8 means a logic high level, and the reference symbol 'L' means a logic low level.

The divided clock generation circuit 21 of the write leveling control circuit 20 divides the frequency of the clock CLK in response to the write leveling control signal WTLEV of the logic low level, and generates the first divided clock DCLK<1> of a logic high level from a time T11 to a time T13. The divided clock generation circuit 21 of the write leveling control circuit 20 divides the frequency of the clock CLK in response to the write leveling control signal WTLEV of the logic low level, and generates the second divided clock DCLK<1> of the logic high level from a time T12 to a time T14. The divided clock generation circuit 21 of the write leveling control circuit 20 divides the frequency of the clock CLK in response to the write leveling control signal WTLEV of the logic low level, and generates the third divided clock DCLK<3> of the logic high level from a time T13 to a time T15. The divided clock generation circuit 21 of the write leveling control circuit 20 divides the frequency of the clock CLK in response to the write leveling control signal WTLEV of the logic low level, and generates the fourth divided clock DCLK<4> of the logic high level from a time T14 to a time T16. The divided clock generation circuit 21 of the write leveling control circuit 20 divides the frequency of the clock CLK in response to the write leveling control signal WTLEV of the logic low level, and generates the first to fourth divided clocks DCLK<1:4> which have the phase difference of 90°. The first to fourth divided clocks DCLK<1:4> are generated as signals which have a frequency two times lower than the clock CLK.

The write clock generation circuit 22 outputs the first divided clock DCLK<1> of the logic high level as the first write clock WCLK<1> from the time T11 to the time T13 in response to the write leveling control signal WTLEV of the logic low level. The write clock generation circuit 22 outputs the second divided clock DCLK<2> of the logic high level as the second write clock WCLK<2> from the time T12 to the time T14 in response to the write leveling control signal WTLEV of the logic low level. The write clock generation circuit 22 outputs the third divided clock DCLK<3> of the logic high level as the third write clock WCLK<3> from the time T13 to the time T15 in response to the write leveling control signal WTLEV of the logic low level. The write clock generation circuit 22 outputs the fourth divided clock DCLK<4> of the logic high level as the fourth write clock WCLK<4> from the time T14 to the time T16 in response to the write leveling control signal WTLEV of the logic low level.

The signal transfer circuit 30 outputs the first write clock WCLK<1> of a logic high level as the first transfer clock TCLK<1> from the time T11 to the time T13 in response to the write leveling control signal WTLEV of the logic low level. The signal transfer circuit 30 outputs the second write clock WCLK<2> of the logic high level as the second transfer clock TCLK<2> from the time T12 to the time T14 in response to the write leveling control signal WTLEV of the logic low level. The signal transfer circuit 30 outputs the third write clock WCLK<3> of the logic high level as the third transfer clock TCLK<3> from the time T13 to the time T15 in response to the write leveling control signal WTLEV of the logic low level. The signal transfer circuit 30 outputs the fourth write clock WCLK<4> of the logic high level as the fourth transfer clock TCLK<4> from the time T14 to the time T16 in response to the write leveling control signal WTLEV of the logic low level. In FIG. 8, since the first to fourth write clocks WCLK<1:4> are generated to have the same phases as the first to fourth transfer clocks TCLK<1:4>, the first to fourth write clocks WCLK<1:4> and the first to fourth transfer clocks TCLK<1:4> are illustrated as the same signals.

The signal combination circuit 41 generates the internal clock ICLK which level-transitions to the logic high level in response to the first transfer clock TCLK<1> of a logic high level at the time T11. The signal combination circuit 41 generates the internal clock ICLK which level-transitions to the logic low level in response to the second transfer clock TCLK<2> of the logic high level at the time T12. The signal combination circuit 41 generates the internal clock ICLK which level-transitions to the logic high level in response to the third transfer clock TCLK<3> of the logic high level at the time T13. The signal combination circuit 41 generates the internal clock ICLK which level-transitions to the logic low level in response to the fourth transfer clock TCLK<4> of the logic high level at the time T14.

Because operation after the time T14 is the same as the operation from the time T11 to the time T14, detailed descriptions thereof will be omitted herein.

In this way, the semiconductor device may generate the internal clock ICLK which toggles, from the first to fourth divided clocks DCLK<1:4> inputted through the first to fourth transfer paths 31, 32, 33 and 34 in the write leveling operation.

As is apparent from the above descriptions, the semiconductor device in accordance with an embodiment may prevent a tDQSS characteristic from being degraded, by sharing a transfer path for a write operation and a transfer path for a write leveling operation. Also, the semiconductor device in accordance with an embodiment may reduce an area and decrease the number of input/output lines, by sharing a transfer path for a write operation and a transfer path for a write leveling operation.

The semiconductor device described above with reference to FIGS. 1 to 8 may be applied to an electronic system which includes a memory system, a graphic system, a computing system or a mobile system. For example, referring to FIG. 9, an electronic system 1000 in accordance with an embodiment may include a data storage 1001, a memory controller 1002, a buffer memory 1003, and an input/output interface 1004.

Figure 9:
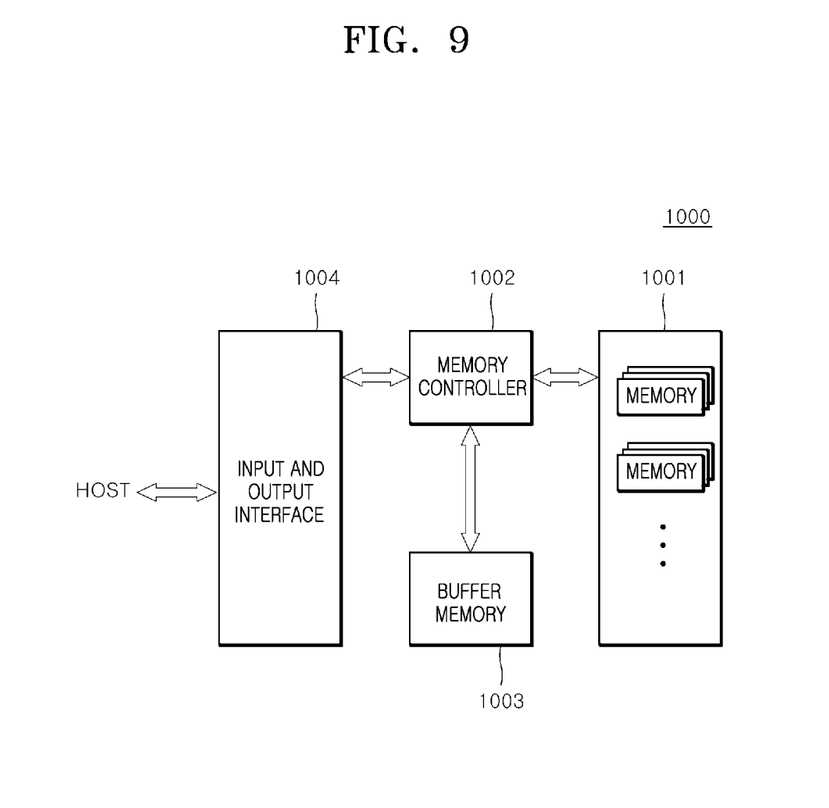
FIG. 9 is a diagram illustrating a representation of an example of a configuration of an electronic system to which the semiconductor device shown in FIGS. 1 to 8 is applied.

The data storage 1001 stores data applied from the memory controller 1002, and reads out stored data and outputs the read-out data to the memory controller 1002, according to control signals from the memory controller 1002. The data storage 1001 may include the semiconductor device shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 9, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
an input clock generation circuit suitable for shifting a write command in synchronization with a clock, and generating first and second input clocks;
a write leveling control circuit suitable for dividing a frequency of the clock in response to a write leveling control signal, and generating first to fourth write clocks; and
a signal transfer circuit suitable for transferring the first and second input clocks as first and second transfer clocks in a write operation, and transferring the first to fourth write clocks as first to fourth transfer clocks in a write leveling operation.

2. The semiconductor device according to claim 1, wherein the first and second input clocks and the first and second write clocks are signals which are transferred as the respective first and second transfer clocks through the same respective transfer paths.

3. The semiconductor device according to claim 1, wherein the write leveling control signal is a signal which is enabled to enter the write leveling operation for compensating for a phase difference between the clock and a strobe signal.

4. The semiconductor device according to claim 1, wherein the input clock generation circuit comprises:
a first shifting circuit suitable for shifting the write command in response to the clock, and outputting the first input clock; and
a second shifting circuit suitable for shifting the first input clock in response to the clock, and outputting the second input clock.

5. The semiconductor device according to claim 1, wherein the write leveling control circuit comprises:
a divided clock generation circuit suitable for dividing the frequency of the clock and generating first to fourth divided clocks; and
a write clock generation circuit suitable for outputting the first to fourth divided clocks as the first to fourth write clocks in response to the write command and the write leveling control signal.

6. The semiconductor device according to claim 5, wherein the write clock generation circuit comprises:
a control signal generation circuit suitable for generating a control signal which is enabled if any one of the write command and the write leveling control signal is inputted; and
a buffer circuit suitable for buffering the first to fourth divided clocks in response to the control signal, and outputting the first to fourth write clocks.

7. The semiconductor device according to claim 1, wherein the signal transfer circuit comprises:
a first transfer path suitable for transferring the first input clock or the first write clock as the first transfer clock in response to the write command and the write leveling control signal;
a second transfer path suitable for transferring the second input clock or the second write clock as the second transfer clock in response to the write command and the write leveling control signal;
a third transfer path suitable for transferring the third write clock as the third transfer clock in response to the write leveling control signal; and
a fourth transfer path suitable for transferring the fourth write clock as the fourth transfer clock in response to the write leveling control signal.

8. The semiconductor device according to claim 7, wherein the first transfer path comprises:
a first logic circuit suitable for outputting the first write clock as a first pre-clock in response to the write command the write leveling control signal;
a first selective transfer circuit suitable for outputting one of the first pre-clock and the first input clock as a first selected clock in response to the write leveling control signal; and
a first input/output line suitable for transferring the first selected clock as the first transfer clock.

9. The semiconductor device according to claim 7, wherein the second transfer path comprises:
a second logic circuit suitable for outputting the second write clock as a second pre-clock in response to the write command the write leveling control signal;
a second selective transfer circuit suitable for outputting one of the second pre-clock and the second input clock as a second selected clock in response to the write leveling control signal; and
a second input/output line suitable for transferring the second selected clock as the second transfer clock.

10. The semiconductor device according to claim 7, wherein the third transfer path comprises:
a third logic circuit suitable for outputting the third write clock as a third pre-clock in response to the write leveling control signal; and
a third input/output line suitable for transferring the third pre-clock as the third transfer clock.

11. The semiconductor device according to claim 7, wherein the fourth transfer path comprises:
a fourth logic circuit suitable for outputting the fourth write clock as a fourth pre-clock in response to the write leveling control signal; and
a fourth input/output line suitable for transferring the fourth pre-clock as the fourth transfer clock.

12. A semiconductor device comprising:
a signal transfer circuit suitable for transferring first and second input clocks or first and second write clocks as respective first and second transfer clocks through respective first and second transfer paths in response to a write command and a write leveling control signal, and transferring third and fourth write clocks as respective third and fourth transfer clocks through respective third and fourth transfer paths; and an internal circuit suitable for detecting a phase difference between an internal clock generated by combining the first to fourth transfer clocks and a strobe signal, and storing input data synchronized with the strobe signal, as internal data, in synchronization with the internal clock.

13. The semiconductor device according to claim 12, wherein the first and second input clocks are signals which are generated by shifting the write command in synchronization with a clock in a write operation.

14. The semiconductor device according to claim 12, wherein the first to fourth write clocks are signals which are generated by dividing a frequency of a clock in a write leveling operation.

15. The semiconductor device according to claim 12, wherein
the write leveling control signal is a signal which is enabled to enter a write leveling operation for compensating for a phase difference between a clock and the strobe signal.

16. The semiconductor device according to claim 12, wherein the first transfer path comprises:
a first logic circuit suitable for outputting the first write clock as a first pre-clock in response to the write command the write leveling control signal;
a first selective transfer circuit suitable for outputting one of the first pre-clock and the first input clock as a first selected clock in response to the write leveling control signal; and
a first input/output line suitable for transferring the first selected clock as the first transfer clock.

17. The semiconductor device according to claim 12, wherein the second transfer path comprises:
a second logic circuit suitable for outputting the second write clock as a second pre-clock in response to the write command the write leveling control signal;
a second selective transfer circuit suitable for outputting one of the second pre-clock and the second input clock as a second selected clock in response to the write leveling control signal; and
a second input/output line suitable for transferring the second selected clock as the second transfer clock.

18. The semiconductor device according to claim 12, wherein the third transfer path comprises:
a third logic circuit suitable for outputting the third write clock as a third pre-clock in response to the write leveling control signal; and
a third input/output line suitable for transferring the third pre-clock as the third transfer clock.

19. The semiconductor device according to claim 12, wherein the fourth transfer path comprises:
a fourth logic circuit suitable for outputting the fourth write clock as a fourth pre-clock in response to the write leveling control signal; and
a fourth input/output line suitable for transferring the fourth pre-clock as the fourth transfer clock.

20. The semiconductor device according to claim 12, wherein the internal circuit comprises:
a signal combination circuit suitable for generating the internal clock which toggles in response to rising edges of the first to fourth transfer clocks;
a detection circuit suitable for comparing a phase of the internal clock and a phase of the strobe signal, and detecting a phase difference of the internal clock and the strobe signal;
a data latch circuit suitable for latching the input data in synchronization with the strobe signal, and outputting the latched input data as latch data;
a data transfer circuit suitable for transferring the latch data as the internal data in synchronization with the internal clock; and
a memory circuit suitable for storing the internal data in response to the write command.

* * * * *